United States Patent [19]

Kawaguchi et al.

[11] Patent Number: 4,484,814

[45] Date of Patent: Nov. 27, 1984

[54] SUPERCONDUCTIVE MAGNET

[75] Inventors: Takeo Kawaguchi; Takashi Sato, both of Kobe, Japan

[73] Assignee: Mitsubishi Denki Kabushiki Kaisha, Tokyo, Japan

[21] Appl. No.: 495,822

[22] Filed: May 18, 1983

[30] Foreign Application Priority Data

May 28, 1982 [JP] Japan ................... 57-91617

[51] Int. Cl.³ .............................. H01F 7/00
[52] U.S. Cl. .................... 335/301; 335/216; 174/15 CA
[58] Field of Search ............ 335/216, 211, 301; 174/15 CA, 15 R; 62/514

[56] References Cited

U.S. PATENT DOCUMENTS

| | | | |
|---|---|---|---|
| 3,008,044 | 11/1961 | Buchhold | 335/216 X |
| 3,177,408 | 4/1965 | Mills et al. | 335/216 X |
| 3,198,994 | 8/1965 | Hildebrandt et al. | 335/216 |
| 3,273,094 | 9/1966 | Jones et al. | 335/216 |
| 3,513,421 | 5/1970 | Schindler et al. | 335/216 |

Primary Examiner—George Harris
Attorney, Agent, or Firm—Oblon, Fisher, Spivak, McClelland & Maier

[57] ABSTRACT

A superconductive magnet comprises in combination a magnetic shield made of a magnetic material and having an opening in the wall surface thereof, which passes through it, and a superconductive winding which is received and held within said magnetic shield, wherein the wall surface of said magnetic shield positioned in symmetry with the position of said opening part in both circumferential and longitudinal directions is made of a non-magnetic material.

3 Claims, 2 Drawing Figures

SUPERCONDUCTIVE MAGNET

This invention relates to a superconductive magnet, and, more particularly, it is concerned with a magnetic shield structure of the superconductive magnet having such magnetic shield.

Figure 1:
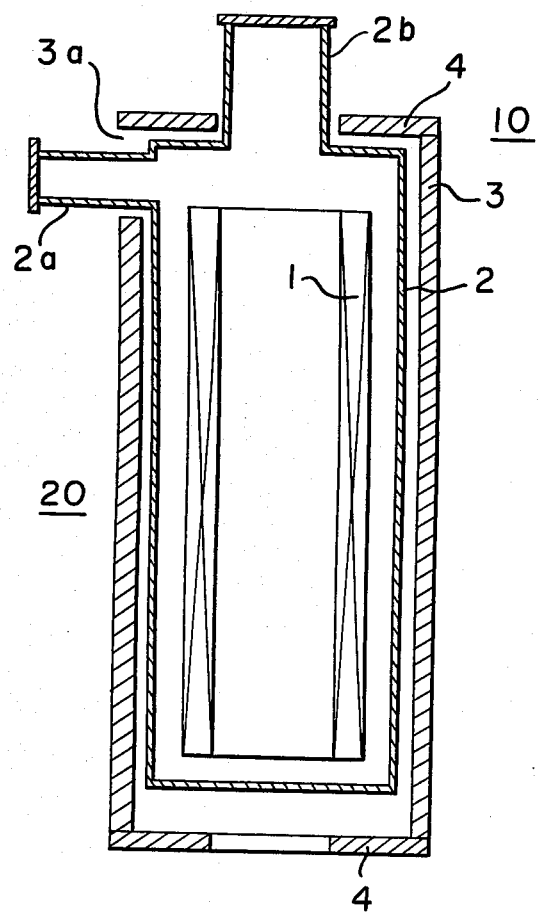

As this type of the device, there has so far been known such one as shown in FIG. 1 of the accompanying drawing.

In the drawing, a reference numeral 1 designates a superconductive winding; a numeral 2 refers to a vacuum container made of a non-magnetic material, which receives and holds therein the superconductive winding 1 and fixedly secures the same with an adiabatic supporting member (not shown) having good adiabatic property; a numeral 3 refers to a shield barrel made of a magnetic material; and a reference numeral 4 denotes shielding end plates also made of such magnetic material, these two members 3 and 4 constituting a magnetic shield 10. The magnetic shield 10 is placed at the outer periphery of the superconductive winding 1 and the vacuum container 2. Both magnetic shield 10 and vacuum container 2 are fixed by mechanical means. The vacuum container 2 is provided with a port 2a and a duct 2b at its upper part. The port 2a receives and holds in it a coolant supply pipe and a current supply wiring (both being not shown) for cooling and exciting the superconductive winding 1, while the duct 2b is for insertion of a test specimen into the bore of the superconductive winding 1. The shield barrel 3 has an opening 3a formed by cutting out a part of the barrel portion for permitting the port 2a to pass therethrough. A superconductive magnet 20 is thus constructed with the superconductive winding 1, the vacuum container 2, and the magnetic shield 10. Incidentally, a radiation heat shield (not shown) may in some case be provided between the superconductive winding 1 and the vacuum container 2. It is also possible that the airtightness of the vacuum container 2 and the functions of the port 2a and the duct 2b are given to the magnetic shield 10 so as to use the magnetic shield 10 as a substitution for the vacuum chamber 2.

The superconductive magnet of the above-described construction operates in the following manner.

The superconductive winding 1 is cooled to a cryogenic condition with a refrigerant which is introduced to the winding through the port 2a, and generates a high magnetic field of several Teslas in the inner bore of the superconductive winding by passing electric current which is supplied thereto through the port 2a.

At the same time, however, it generates leakage magnetic field at its outer periphery. Since this leakage magnetic field causes mal-effect to measuring instruments, etc., consideration is given to provide the magnetic shield 10 made of a magnetic material on the outer periphery of the superconductive winding 1 to absorb magnetic line of force generated from this superconductive winding 1 so that no magnetic field may not leak outside. On the other hand, since the shield barrel 3 has formed therein the opening 3a to permit the port 2a to pass through it, there occurs magnetic asymmetry in both circumferential and longitudinal directions of the magnetic shield 10, whereby unbalanced electromagnetic force generates between the superconductive winding 1 and the magnetic field 10. As this unbalanced electromagnetic force is sustained by the adiabatic supporting member (not shown) provided between the superconductive winding 1 and the vacuum container 2, the conventional superconductive magnet has various disadvantages such that the size of the adiabatic supporting member becomes inevitably large, the amount of heat intrusion into the superconductive winding 1 increases, and additional work becomes necessary to estimate this unbalanced electromagnetic force, and so on.

The present invention has been made with a view to eliminating these disadvantages inherent in the conventional superconductive magnet as mentioned above, and aims at providing the superconductive magnet, in which a non-magnetic material is used for a portion of the magnetic shield, which constitutes a symmetrical position with the opening portion in both circumferential and longitudinal directions thereof, to render the portion to be magnetically symmetrical and to thereby prevent occurrence of the unbalanced electromagnetic force.

According to the present invention, in general aspect of it, there is provided a superconductive magnet which comprises in combination: a magnetic shield made of a magnetic material and having an opening in the wall surface thereof, which passes through it, and a superconductive winding which is received and held within said magnetic shield, characterized in that the wall surface of said magnetic shield positioned in symmetry with the position of said opening part in both circumferential and longitudinal directions is made of a non-magnetic material.

The foregoing object, other objects as well as specific construction and function of the superconductive magnet according to the present invention will become more apparent and understandable from the following detailed description of a preferred embodiment thereof when read in conjunction with the accompanying drawing.

Figure 2:
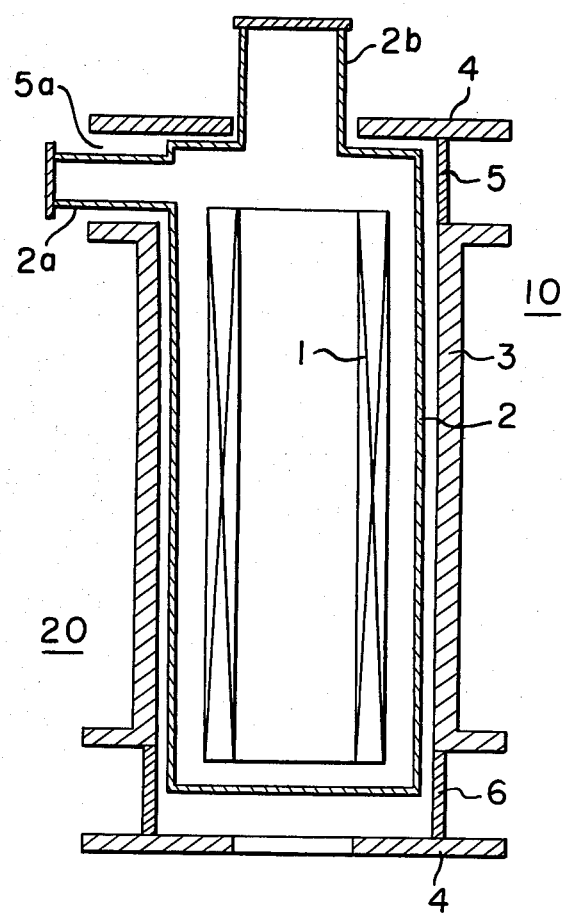

In the drawing:

FIG. 1 is a longitudinal cross-sectional view of a conventional superconductive magnet; and FIG. 2 is also a longitudinal cross-sectional view of one embodiment of the superconductive magnet according to the present invention.

In the following, the superconductive magnet of the present invention, in one preferred embodiment thereof, will be explained in reference to FIG. 2.

In the drawing, reference numerals 1, 2, 2a 2b, 3 and 4 designate the same component parts as in the conventional superconductive magnet shown in FIG. 1. Numerals 5 and 6 respectively refer to the non-magnetic upper and lower barrels made of non-magnetic material. An opening 5a for permitting passage of the port 2a is formed in one part of the non-magnetic upper barrel 5. The upper barrel 5 is placed adjacent to an upper shielding and plate 4 and the lower barrel 6 is placed adjacent to a lower shielding and plate 4.

Since the present invention uses a non-magnetic material for constructing the non-magnetic upper barrel 5 having therein the opening 5a for passage of the port 2a and the non-magnetic lower barrel 6 which becomes symmetrical with the non-magnetic upper barrel 5 in the lengthwise direction, the magnetic shield 10 takes a magnetic symmetry accordingly, and no unbalanced electromagnetic force generates between the magnetic shield 10 and the superconductive winding 1, so that the adiabatic supporting member can be made small in size, and the amount of heat instrusion into the superconductive winding 1 is reduced. Incidentally, the above-described embodiment is directed to a construction, wherein the vacuum container 2 and the magnetic shield 10 are separated, but it is of course feasible that the same effect can be obtained when the present invention is applied to a construction, in which the magnetic shield 10 is used as a substitution for the vacuum container 2.

As stated in the foregoing, according to the present invention, it becomes possible to provide the superconductive magnet which is capable of preventing the unbalanced electromagnetic force from generating by constructing the wall surface of the magnetic shield with the non-magnetic material, the wall surface of which is positioned in symmetry with the position of the opening part of the magnetic shield in both circumferential and longitudinal directions.

Although, in the foregoing, the present invention has been described with reference to a preferred embodiment thereof, it should be noted that this embodiment is illustrative only and not so restrictive and that any changes and modifications may be made by those persons skilled in the art within the ambit of the present invention as recited in the appended claims.

I claim:

1. A superconductive magnet shield enclosure for superconductive magnet comprising:
   magnetic shielding material substantially enclosing said superconductor magnet;
   connecting port means contained in said magnetic shielding material for providing coolant supply pipe and current supply wiring pathways; and
   non-magnetic material positioned in longitudinal and circumferential symmetrical positions from said connecting port means for maintaining the magnetic symmetry of said magnetic shield.

2. A superconductive magnet according to claim 1 wherein upper and and lower barrels made of non-magnetic material are respectively fitted to the upper and lower parts of a vacuum container.

3. A superconductive magnet according to claim 2 wherein said upper and lower barrels are respectively placed adjacent to upper and lower shielding end plates.

* * * * *